(12) United States Patent  (10) Patent No.: US 7,884,482 B2
Ozawa et al.  (45) Date of Patent: Feb. 8, 2011

(54) FLIP-CHIP MOUNTING SUBSTRATE

(75) Inventors: Takashi Ozawa, Nagano (JP); Yasushi Araki, Nagano (JP); Masatoshi Nakamura, Nagano (JP); Seiji Sato, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 566 days.

(21) Appl. No.: 11/957,866

(22) Filed: Dec. 17, 2007

(65) Prior Publication Data
US 2008/0142993 A1    Jun. 19, 2008

(30) Foreign Application Priority Data
Dec. 19, 2006  (JP) .............................. 2006-341043

(51) Int. Cl.
H01L 23/48  (2006.01)
H01L 23/52  (2006.01)
(52) U.S. Cl. .................. 257/773; 257/786; 257/778; 257/E23.02
(58) Field of Classification Search ............. 257/773, 257/786, 778, E23.02
See application file for complete search history.

(56) References Cited
U.S. PATENT DOCUMENTS

| | | | | |
|---|---|---|---|---|
| 6,315,541 B1 * | 11/2001 | Maeda et al. | | 425/127 |
| 6,800,947 B2 * | 10/2004 | Sathe | | 257/780 |
| 6,806,556 B2 * | 10/2004 | Ohara | | 257/620 |
| 7,012,339 B2 * | 3/2006 | Terui | | 257/786 |
| 7,239,028 B2 * | 7/2007 | Anzai | | 257/786 |
| 7,408,260 B2 * | 8/2008 | Fjelstad et al. | | 257/734 |
| 2001/0045625 A1 * | 11/2001 | Sakamoto et al. | | 257/666 |
| 2002/0113319 A1 * | 8/2002 | Ohno | | 257/778 |
| 2003/0122213 A1 * | 7/2003 | Hsu et al. | | 257/508 |

FOREIGN PATENT DOCUMENTS

JP    2000-77471    3/2000

* cited by examiner

Primary Examiner—Nitin Parekh
(74) Attorney, Agent, or Firm—Rankin, Hill & Clark LLP

(57) ABSTRACT

It is a flip-chip mounting substrate according to the invention has a wiring pattern in which bonding pads and predetermined parts of lead wires continuously extending from the bonding pads are exposed from an insulating layer or a solder resist. In the flip-chip mounting substrate, exposed parts of the wiring pattern are formed in to a plurality of different shapes. The exposed parts are formed so that the areas of the bonding pads are substantially equal to one another, and that the total areas of predetermined parts of the lead wires continuously extending from the bonding pads are substantially equal to one another.

3 Claims, 12 Drawing Sheets

A-A'

B-B'

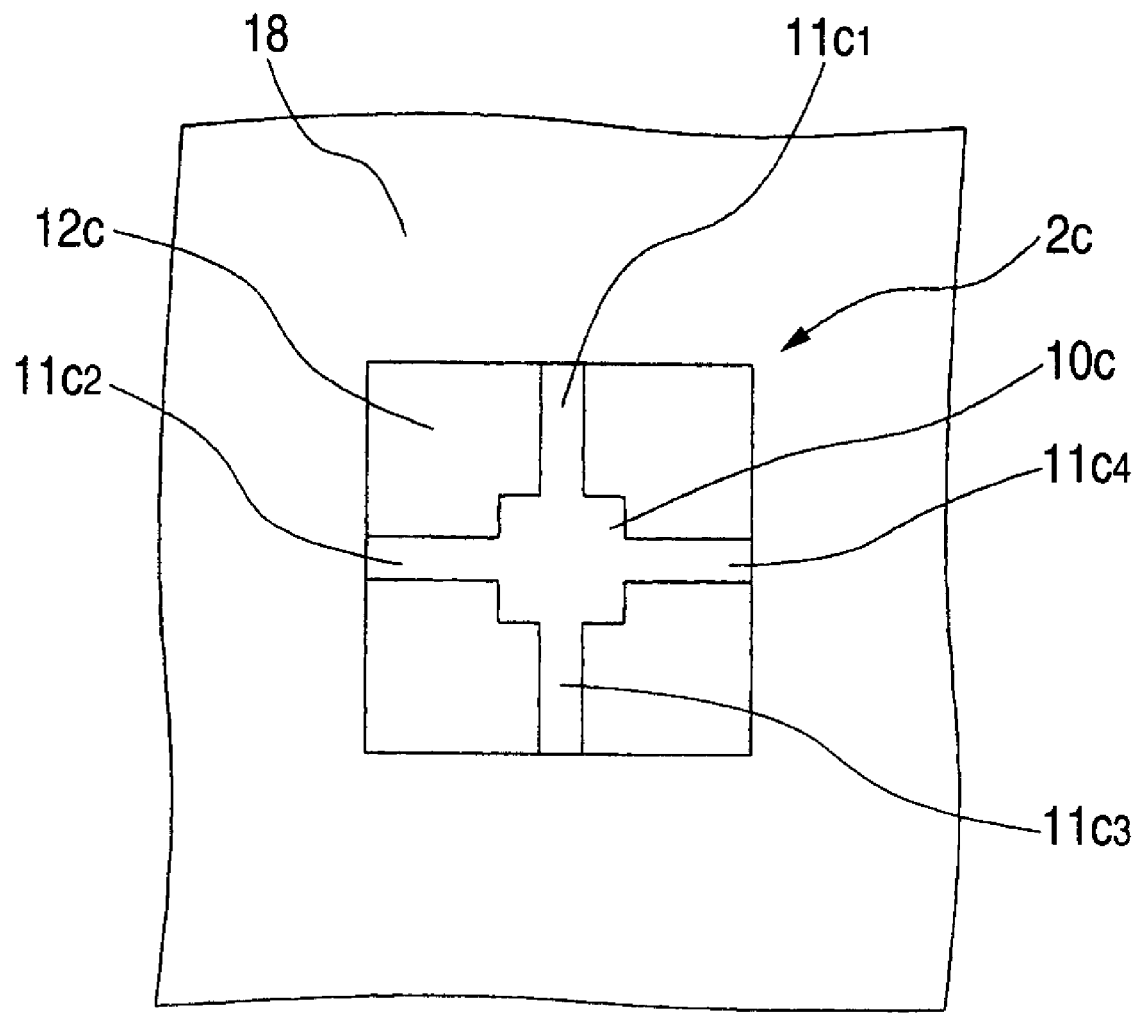

V-V'

W-W'

X-X'

Y-Y'

FLIP-CHIP MOUNTING SUBSTRATE

BACKGROUND OF THE INVENTION

1. Technical Field

The present invention relates to a flip-chip mounting substrate and, more particularly, to a flip-chip mounting substrate having a wiring pattern in which bonding pads and predetermined parts of lead wires continuously extending from the bonding pads are exposed from an insulating layer and a solder resist.

2. Related Art

One of important element technologies enabling the miniaturization and the densification of semiconductor devices is a flip-chip mounting method. The flip-chip mounting method is to form projection electrodes (i.e., bumps) on a circuit surface of a semiconductor chip, to downwardly direct the circuit surface and to connect the circuit surface directly to a mounting substrate so as to electrically connect therebetween.

The miniaturization and the densification of semiconductor devices have been achieved by this flip-chip mounting method, as compared with related methods such as a wire-bonding mounting method. However, the enhancement of the functionalities of semiconductor devices has still been advanced. The flip-chip mounting method have been demanded to cope with a narrower-pitch connection.

Meanwhile, Patent Document 1 describes a flip-chip mounting substrate 100 (see FIG. 13), which is an example of a related flip-chip mounting substrate. According to this example, the flip-chip mounting substrate 100 includes a circuit board 112 on which conductive patterns 113A and 113B are formed. Also, bumps provided on a semiconductor chip are flip-chip mounted on the conductive patterns 113A and 113B. Each of the conductive patterns 113A and 113B includes a connection pad, to which the bump is connected, and an associated one of a wiring pattern 119 and a set of wiring patterns 119A and 119B. A width dimension (W1) of each of the connection pads 120 is set to be larger than width dimensions (W2 and W3) of each of the wiring patterns 119, 119A, and 119B (W1>W2, and W1>W3). Consequently, when a semiconductor chip having a narrow inter-bump pitch is flip-chip-mounted on the flip-chip mounting substrate 11, the connection pads 120, to each of which an associated one of the bumps is formed, can be formed at high density.

[Patent Document 1] JP-A-2000-77471

DISCLOSURE OF THE INVENTION

Problems to be Solved by the Invention

However, the related flip-chip mounting substrate 100 illustrated in FIG. 13 is an example of a case where the bonding pads are provided in a peripheral arrangement. This technical idea cannot be applied directly to a flip-chip mounting substrate of the type, in which bonding-pads are provided in an area array arrangement. The reason is that a longitudinal inter-bonding-pad pitch cannot be narrowed even in a case where elongated bonding pads are provided in an area-array arrangement in the wiring pattern including the elongated bonding pads and the lead wires as illustrated in FIG. 13. Accordingly, there has been an increasing demand for increasing the density of bonding pads, to each of which a bump is connected, so as to enhance the functionalities of semiconductor devices provided on a flip-chip mounting substrate on which bonding-pads are provided in an area array arrangement.

SUMMARY OF THE INVENTION

The invention is accomplished in view of the aforementioned circumstances. An object of the invention is to provide a flip-chip mounting substrate capable of increasing the density of bonding pads, to each of which a bump is connected, in flip-chip mounting of semiconductor chips provided in an area array arrangement, and is to effectively solve problems such as variation in solder pre-coat generated in a process of implementing the flip-chip mounting.

Means for Solving the Problems

The foregoing objects can be solved by the following means for solving the problems.

According to a first aspect of the invention, there is provided a flip-chip mounting substrate including:
  bonding pads,
  an insulating layer or a solder resist, and
  a wiring pattern in which the bonding pads and predetermined parts of lead wires continuously extending from the bonding pads are exposed from the insulating layer or the solder resist, wherein
  exposed parts of the wiring pattern are formed into a plurality of different shapes,
  areas of the bonding pads are substantially equal to one another, and
  total areas of predetermined parts of the lead wires continuously extending from the bonding pads are substantially equal to one another.

According to a second aspect of the invention, there is provided a flip-chip mounting substrate including:
  bonding pads,
  an insulating layer or a solder resist, and
  a wiring pattern in which the bonding pads and predetermined parts of lead wires continuously extending from the bonding pads are exposed from the insulating layer or the solder resist, wherein
  exposed parts of the wiring pattern include at least one of a wiring pattern of which length dimension is longer than a width dimension, and a wiring pattern of which width and length dimensions are substantially equal to each other,
  the exposed parts of the wiring pattern are formed so that areas of the bonding pads are substantially equal to one another and total areas of predetermined parts of the lead wires continuously extending from the bonding pads are substantially equal to one another.

According to a third aspect of the invention, there is provided the flip-chip mounting substrate according to the second aspect, wherein
  a plurality of the wiring patterns, each of which has a width dimension that is longer than a length dimension, are provided on an outer edge part of the substrate so that widthwise side edge portions thereof adjoin one another, and
  the wiring pattern, of which width and length dimensions are substantially equal to each other, is provided in a substrate inner part.

EFFECTS OF THE INVENTION

According to the first aspect of the invention, the total areas of predetermined parts, which are exposed from the insulating layer or the solder resist, of the lead wires continuously extending from the bonding pads are substantially equal to one another. With this configuration, the total amounts of solders drawn to the bonding pads from the exposed parts of the lead wires at solder pre-coating can be made to be substantially equal to one another. Additionally, according to the first flip-chip mounting substrate of the invention, the areas of the bonding pads are substantially equal to one another. With this configuration, the shapes of the solder bumps formed on the bonding pads can be made to be substantially the same with one another. Consequently, variation in the shape of the solder bump can be eliminated. Additionally, the first flip-chip mounting substrate of the invention can have an effect of stabilizing a bonding strength when the semiconductor chip and the flip-chip mounting substrate are connected to each other.

According to the second and third aspects of the invention, the wiring pattern having a part exposed from the insulating layer or the solder resist, according to which the inter-bonding-pad pitches in all of the width (or lateral) direction and the up-down direction can be reduced, is used together with the wiring pattern having a part, which is exposed from the insulating layer or the solder resist and has a length dimension longer than a width dimension, and according to which the inter-bonding-pad-pitch can be reduced only in the width direction. Consequently, a constraint on the inter-pad pitch at formation of the wiring pattern demanded corresponding to each of the substrate inner part and the substrate outer edge part can be satisfied. Accordingly, the density of the wiring patterns provided in an area array arrangement, which are flip-chip-mounted on the flip-chip mounting substrate, can be increased.

BRIEF DESCRIPTION OF THE DRAWINGS

FIG. 6 is a schematic view illustrating a wiring pattern formed on a flip-chip mounting substrate according to a second embodiment.

DETAILED DESCRIPTION OF THE PREFERRED EMBODIMENTS

Best Mode for Carrying Out the Invention

First Embodiment

Figure 1:
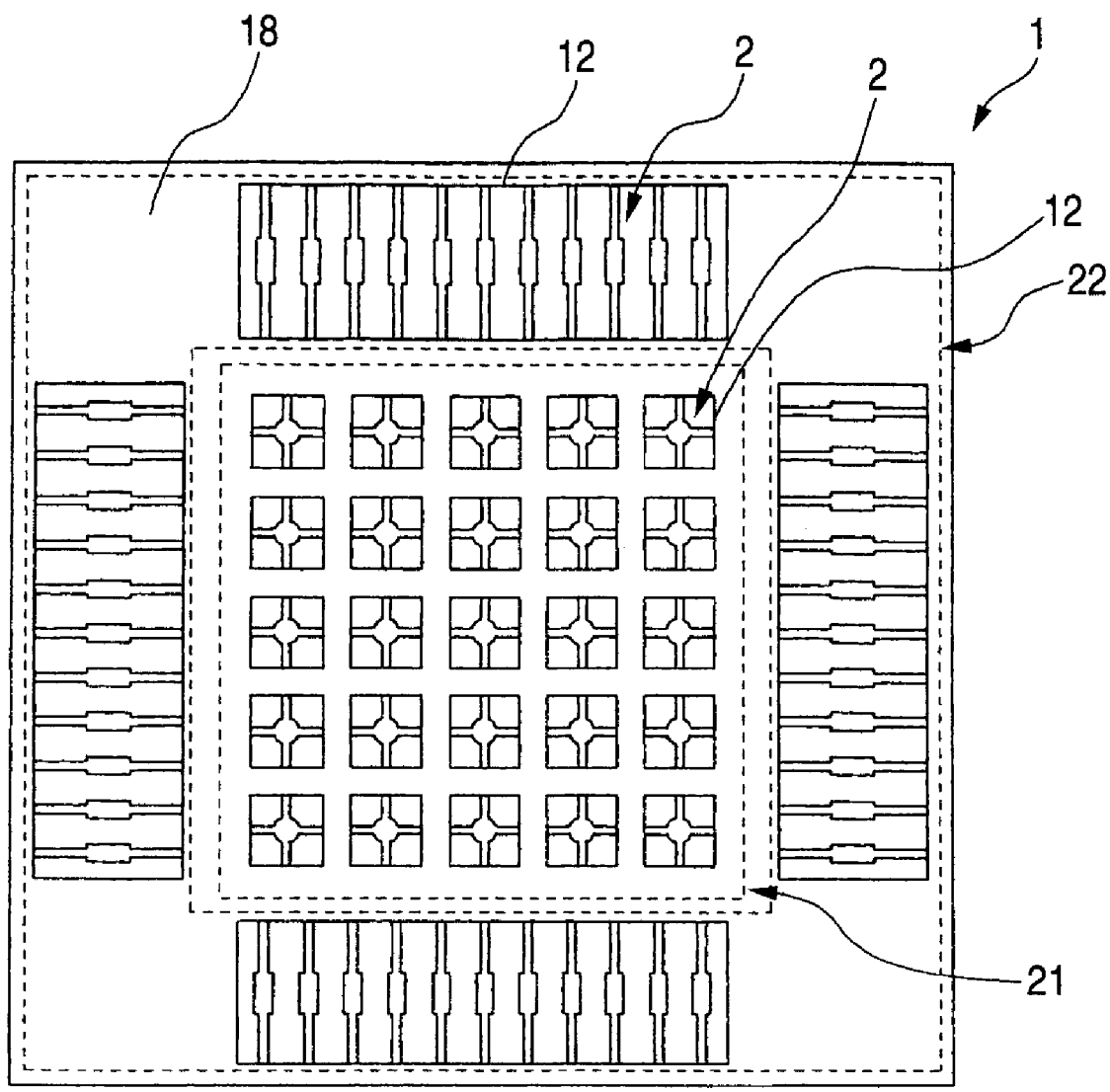
FIG. 1 is a schematic view illustrating an example of a flip-chip mounting substrate according to a first embodiment.
Figure 2A:
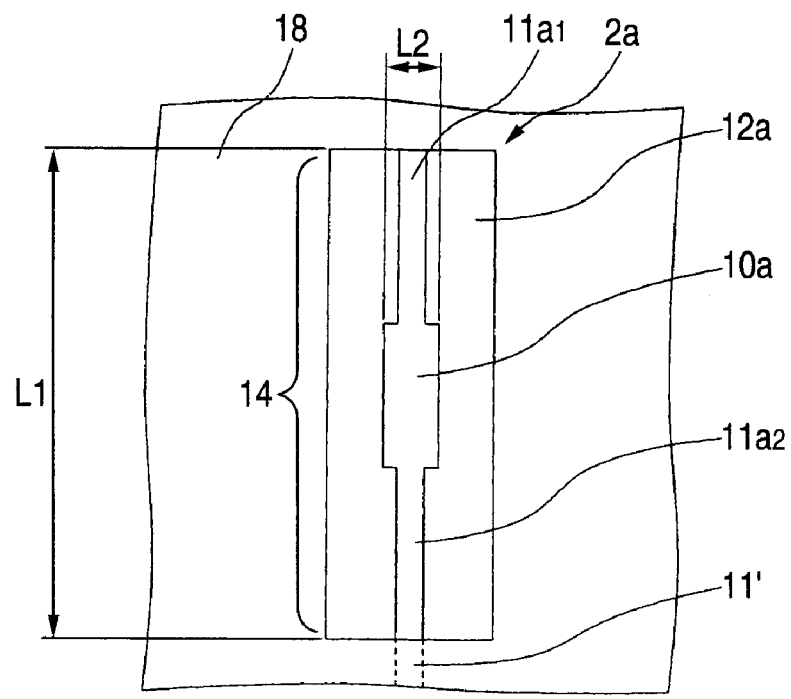
FIGS. 2A and 2B are schematic views illustrating the configuration of the first embodiment of a wiring pattern formed on the flip-chip mounting substrate illustrated in FIG. 1.
Figure 2B:
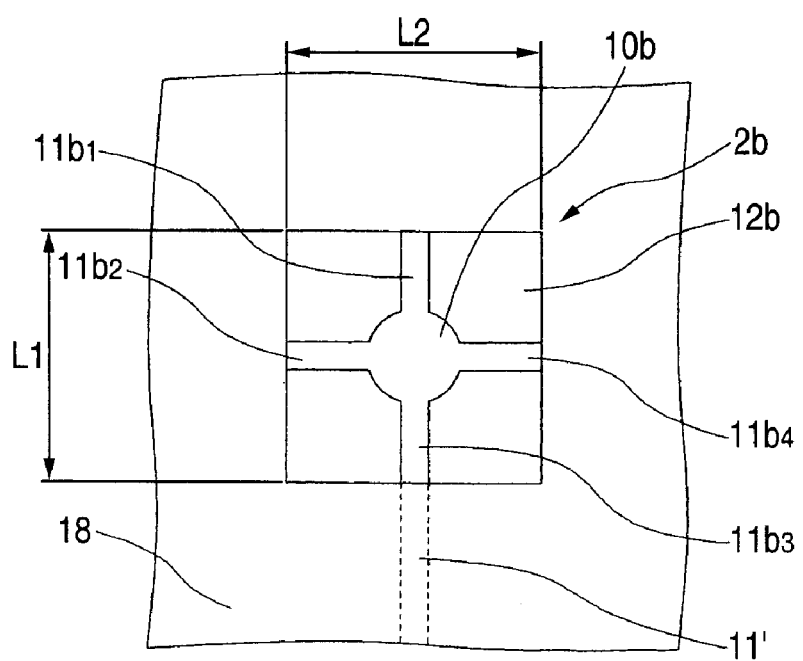
Figure 3:
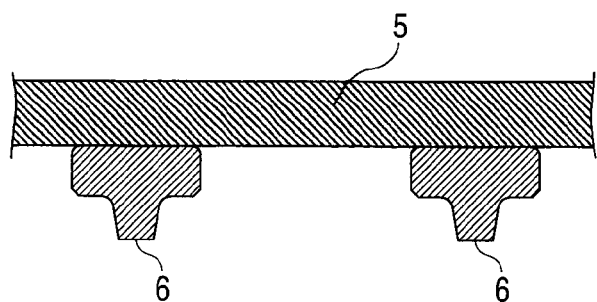
FIG. 3 is a reference view illustrating the configuration of a semiconductor chip flip-chip-mounted on the flip-chip mounting substrate illustrated in FIG. 1.
Figure 4A:
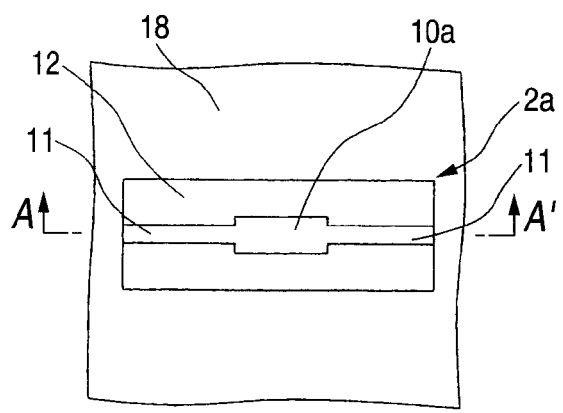
FIGS. 4A to 4D are views illustrating the configuration of solder bumps and solder films formed on wiring patterns on the flip-chip-mounted on the flip-chip mounting substrate illustrated in FIG. 1.
Figure 4C:
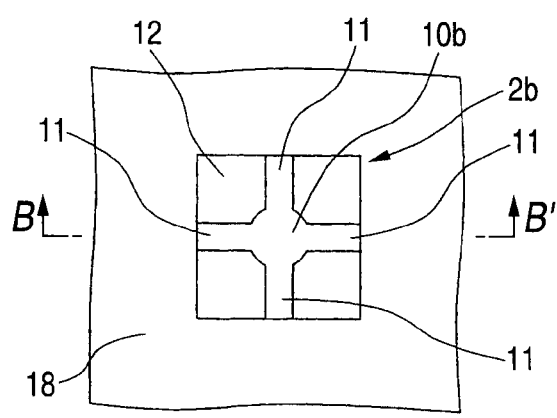
Figure 4B:
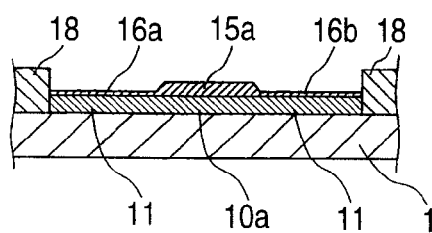
Figure 4D:
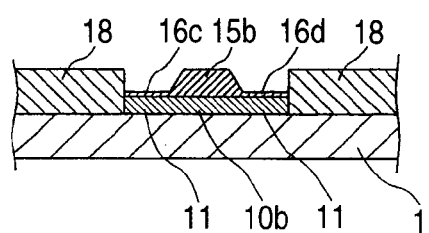
Figure 5A:
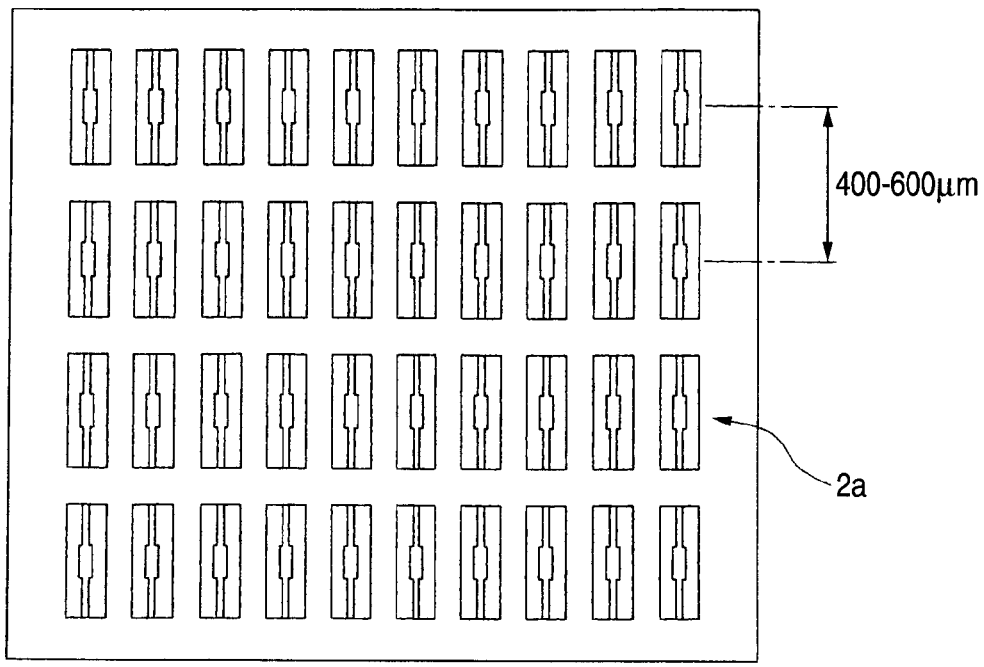
FIGS. 5A and 5B are comparison views illustrating wiring patterns formed on the flip-chip mounting substrate illustrated in FIG. 1.
Figure 5B:
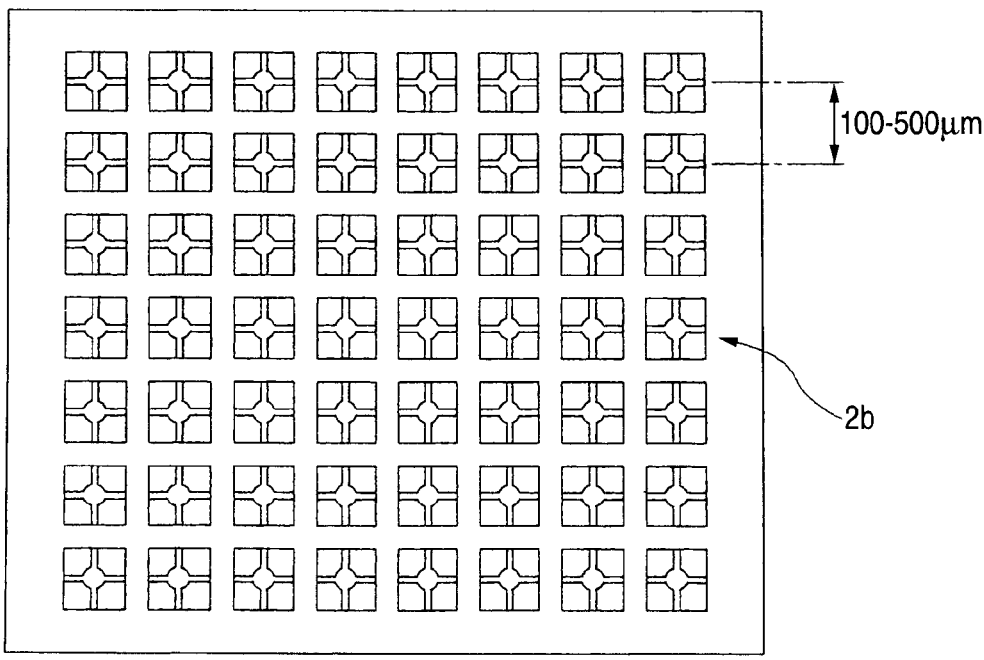
Figure 7A:
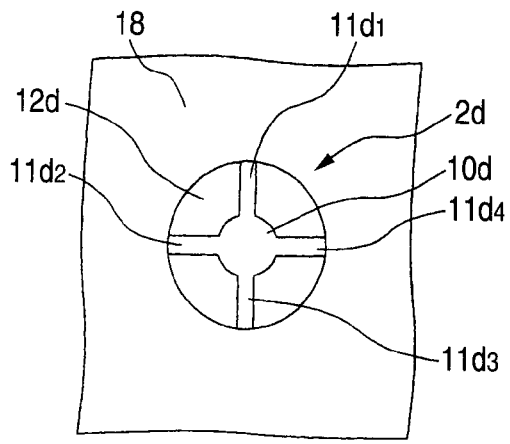
FIGS. 7A to 7F are schematic views illustrating wiring patterns formed on a flip-chip mounting substrate according to a third embodiment.
Figure 7B:
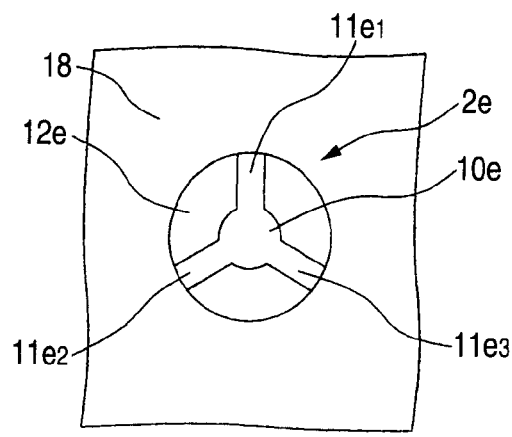
Figure 7C:
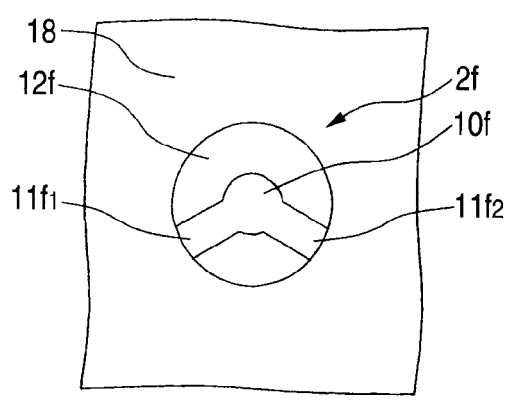
Figure 7D:
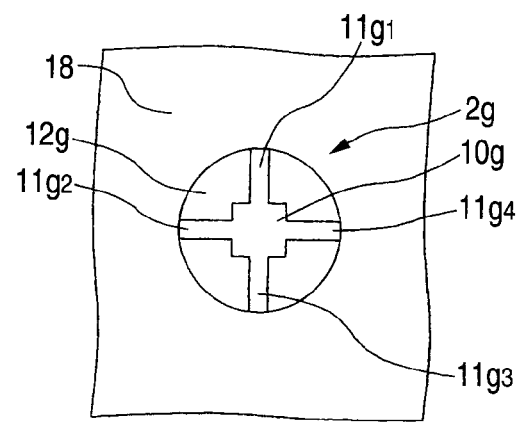
Figure 7E:
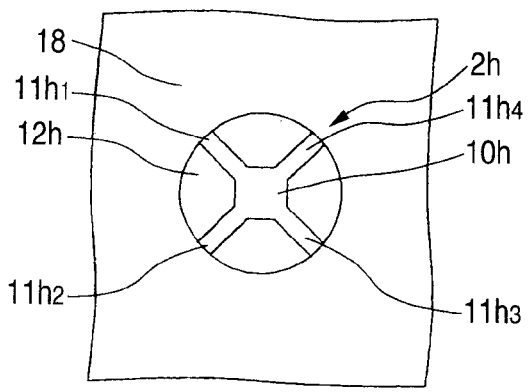
Figure 7F:
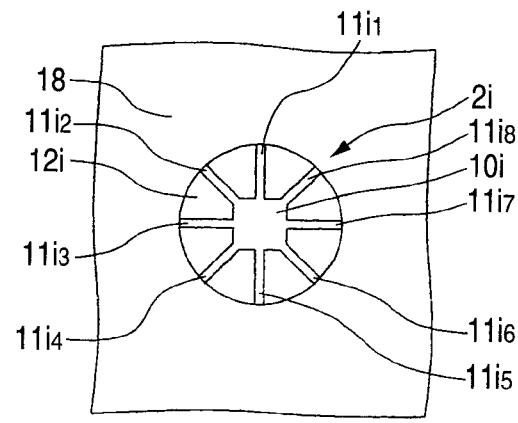
Figure 8:
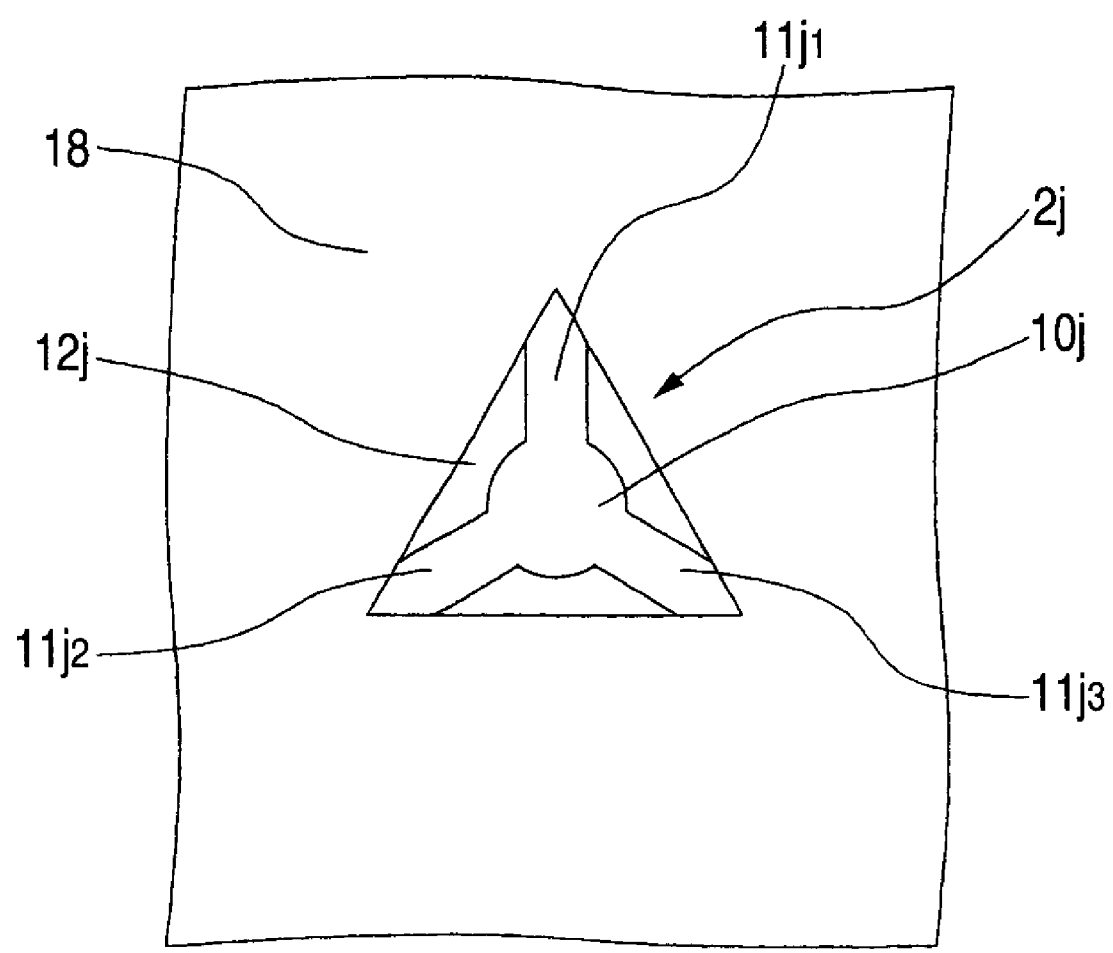
FIG. 8 is a schematic view illustrating a wiring pattern formed on a flip-chip mounting substrate according to a forth embodiment.
Figure 9:
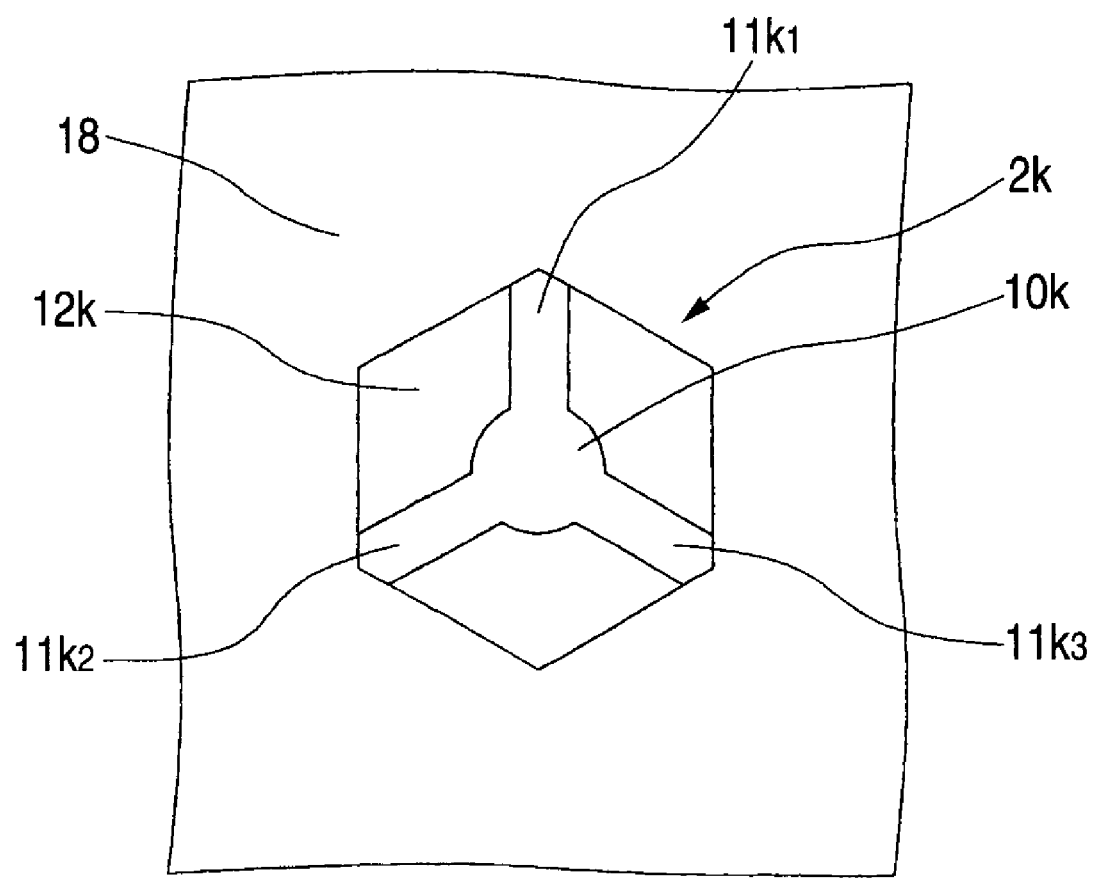
FIG. 9 is a schematic view illustrating a wiring pattern formed on a flip-chip mounting substrate according to a fifth embodiment.
Figure 10:
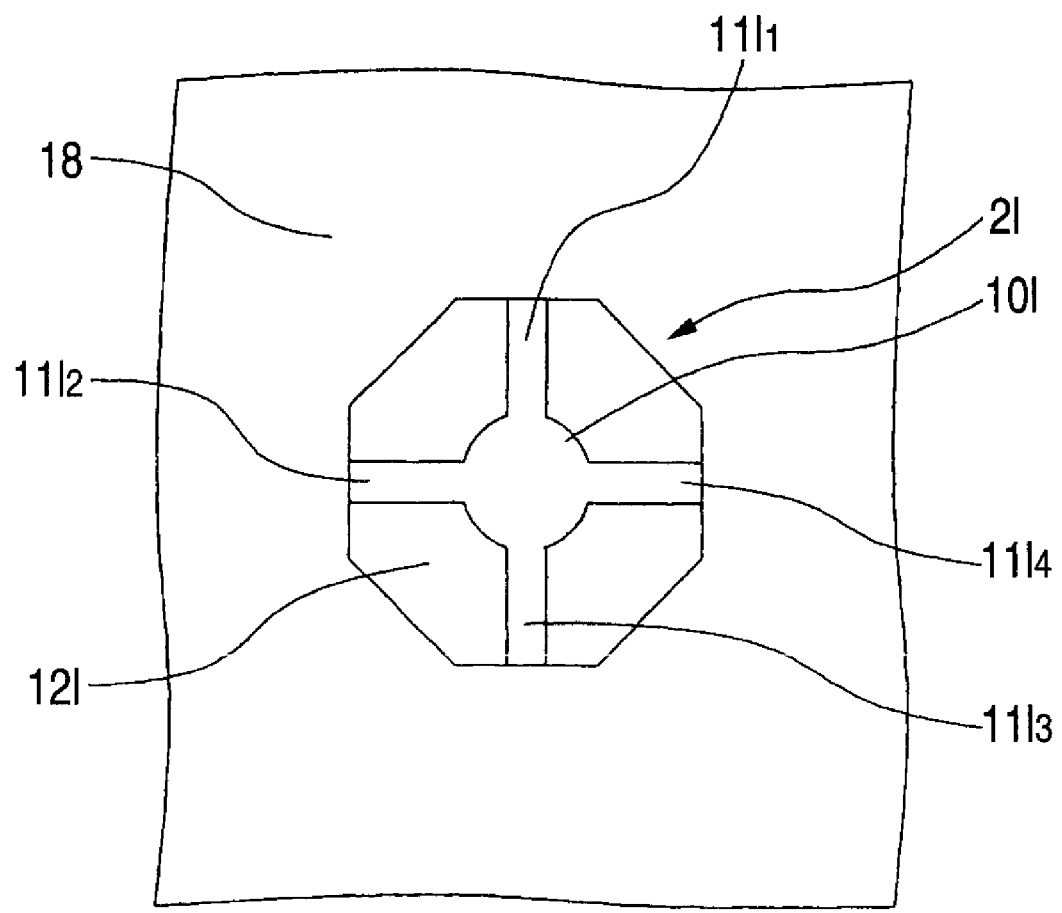
FIG. 10 is a schematic view illustrating a wiring pattern formed on a flip-chip mounting substrate according to a sixth embodiment.

Hereinafter, an embodiment of the invention is described in detail with reference to the accompanying drawings. FIG. 1 is a schematic view illustrating a flip-chip substrate 1 according to the first embodiment of the invention. FIGS. 2A and 2B are schematic views illustrating the configuration of a wiring pattern 2 formed on the flip-chip mounting substrate 1. FIG. 3 is a reference view illustrating the configuration of a semiconductor chip 5 flip-chip-mounted on the flip-chip mounting substrate 1. FIGS. 4A to 4D are views illustrating the configuration of solder bumps 15 and solder films 16 formed on the wiring pattern 2 on the flip-chip-mounted on the flip-chip mounting substrate 1. FIGS. 5A and 5B are comparison views illustrating wiring pattern 2 formed on the flip-chip mounting substrate 1. FIG. 6 is a schematic view illustrating the wiring pattern 2 formed on the flip-chip mounting substrate 1 according to the second embodiment of the invention. FIGS. 7A to 7F are schematic views illustrating the wiring pattern 2 formed on the flip-chip mounting substrate 1 according to the third embodiment of the invention. FIG. 8 is a schematic view illustrating an example of the wiring pattern 2 formed on the flip-chip mounting substrate 1 according to the forth embodiment of the invention. FIG. 9 is a schematic view illustrating an example of the wiring pattern 2 formed on the flip-chip mounting substrate 1 according to the fifth embodiment of the invention. FIG. 10 is a schematic view illustrating an example of the wiring pattern 2 formed on the flip-chip mounting substrate 1 according to the sixth embodiment of the invention. FIGS. 11A to 11D are schematic views illustrating an example of the wiring pattern 2 formed on the flip-chip mounting substrate 1 according to the seventh embodiment of the invention. FIGS. 12A to 12D are schematic views illustrating an example of the wiring pattern 2 formed on the flip-chip mounting substrate 1 according to the eighth embodiment of the invention. Incidentally, regarding reference numerals used in the drawings, for example, reference numeral 2 is used as a generic reference numeral generically designating reference numerals 2a, . . . , and 2y (this is the same with other reference numerals).

As illustrated in FIGS. 1, 2A and 2B, the flip-chip mounting substrate 1 is configured so that a bonding pad 10, a lead wire 11', and a solder resist 18 serving as an insulating material are formed on a mounting surface. Incidentally, a plurality of holes 12 are provided in the solder resist 18. The bonding pad 10, predetermined parts (hereunder referred to also as a "lead wire exposed portion 11") 11' continuously extending from the bonding pad 10 are exposed from the holes 12. Incidentally, a part of the surface of the flip-chip mounting substrate 1 is exposed from the holes 12. Hereinafter, the constitution including the bonding pad 10, the lead wire exposed portion 11 and the holes 12 is referred to as a wiring pattern 2. Then, flip-chip mounting is performed by putting a semiconductor chip 5 into a face-down position with respect to the flip-chip mounting substrate 1.

The bonding pad 10 is made of, for example, copper (Cu) and is provided at a position to which a bump 6 provided on the semiconductor chip 5 is connected. That is, the bump 6 is connected to the bonding pad 10 exposed from the holes 12.

The lead wire 11' is made of the same material (e.g., copper) as that of the bonding pad 10 and is provided continuously extending therefrom.

The semiconductor chip 5 illustrated in FIG. 3 has a plurality of bumps 6 that are made of, for example, gold (Au) and that are arranged in an area array arrangement. In a case where the semiconductor chip 5 having such Au bumps 6 is flip-chip-mounted on the mounting surface of the flip-chip mounting substrate 1, solder-precoating is performed on the mounting surface of the flip-chip mounting substrate 1 before the semiconductor chip 5 is mounted thereon. More specifically, the solder precoating is performed on the top surfaces of the bonding pads 10 and the lead wire exposed portion 11.

Figure 13:
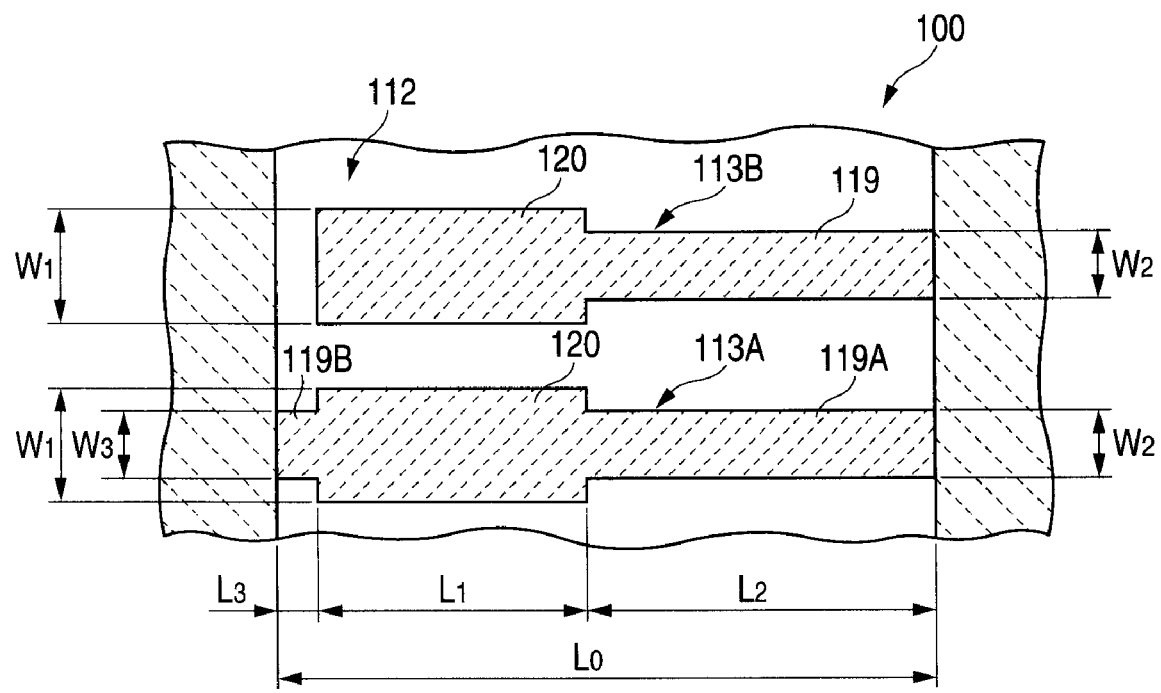
FIG. 13 is a schematic view illustrating a related flip-chip mounting substrate.

Incidentally, in both cases of the related substrate illustrated in FIG. 13 and the substrate according to the invention, an adhesive layer is formed on the wiring pattern exposed from an insulating layer or a solder resist. Subsequently, the wiring pattern is covered with solder powder. Then, the solder powder is heated and molten. The molten solder is concentrated on the bonding pad by a surface tension. Consequently, solder bumps are formed on the bonding pads.

Next, the shape of the wiring pattern 2 is described below. The wiring pattern 2a illustrated in FIG. 2A is provided with a rectangular hole 12a, a rectangular bonding pad 10a, and two lead wire exposed portions $11a_1$ and $11a_2$. The longer side portion of the hole 12a is a side edge portion 14. The length of the longer side portion, that is, the side edge portion 14 ranges from about 250 μm to about 800 μm. The length of the shorter side portion ranges from about 70 μm to about 120 μm. On the other hand, the wiring pattern 2b illustrated in FIG. 2B is provided with a square hole 12b, a circular bonding pad 10b, and four lead wire exposed portions $11b_1$ to $11b_4$. The length of one side of the hole 12b ranges from about 100 μm to about 400 μm.

The wring pattern 2a and the wiring pattern 2b are formed so that the area of the bonding pad 10a is substantially equal to the area of the bonding pad 10b. Additionally, the total area of the lead wires exposed portions $11a_1$ and $11a_2$ is substantially equal to that of the lead wires exposed portions $11b_1$ and $11b_4$. The purport of the term "substantially" is that the "area" (or the "total area") includes a "range" (to be described later), in which similar effects in forming solder bumps on the bonding pad 10 can be obtained, because it is impossible to physically form the shapes having completely the same area, and that it is difficult to exactly determine the boundary between the bonding pad and the lead wire exposed portion 11 continuously extending from the bonding pad 10.

In a case where the wiring patterns 2 are formed in an area array arrangement on the mounting surface of the flip-chip mounting substrate, preferably, the wiring patterns 2a are formed on the substrate outer edge part 22, while the wiring patterns 2b are provided on the substrate inner part 21.

Next, operations and advantages due to the configuration of the substrate are described below.

In a case where the hole 12 is shaped into a square similarly to the wiring pattern 2b illustrated in FIG. 2B, the number of wiring patterns 2, which can be formed in a predetermined constant area, can be set at a large value, as illustrated in FIGS. 5A and 5B, in comparison with the wiring pattern 2a illustrated in FIG. 2A. Thus, the present embodiment has advantages in that the inter-bonding-pad pitches respectively corresponding to the width direction (i.e., the lateral direction) and the up-down direction can be reduced. However, only in the width direction, the inter-bonding-pad pitch in the wiring pattern 2a can be set to be shorter than that in the wiring pattern 2b.

As described above, preferably, the wiring pattern 2b, on which both the inter-bonding-pad pitches respectively corresponding to the width direction (i.e., the lateral direction) and the up-down direction can be reduced, is provided in the substrate inner part 21. This is because of a constraint that when the wiring pattern 2 is formed, both the inter-bonding-pad pitches respectively corresponding to the width direction (i.e., the lateral direction) and the up-down direction should be reduced so as to achieve high-density packaging. On the other hand, preferably, the wiring pattern 2a, on which only the inter-bonding-pad pitch in the width direction can be reduced, is provided on the substrate outer edge part 22 by causing the wide edge portions 14 to adjoin each other. This is because of a large constraint that when the wiring pattern 2 is formed, specifically, the inter-bonding-pad pitch corresponding to the width direction (i.e., the lateral direction) should be reduced so as to achieve high-density packaging. That is, the flip-chip mounting substrate 1 according to the invention employs both the wiring pattern 2a and the wiring pattern 2b. Consequently, the constraints at forming of the wiring patterns 2 respectively requested corresponding to the substrate inner part 21 and the substrate outer edge portion 22 can be satisfied. Consequently, the high density of the semiconductor chips, which have bumps provided in an area array arrangement and are flip-chip-mounted on the flip-chip mounting substrate 1, can be achieved. That is, the flip-chip mounting substrate 1 according to the invention can be miniaturized, as compared with the related flip-chip mounting substrate having bonding pads provided in an area array arrangement. In a case where, specifically, the inter-bonding-pad pitch is set to be what is called a narrow pitch, preferably, the side edge portions 14 of adjacent holes 12a are connected to each other, so that the holes 12 are formed like strips from which a plurality of wiring-patterns 2 are exposed, as illustrated in FIG. 1.

However, the following adverse effects are produced when the flip-chip mounting of wiring-patterns provided in an area array arrangement is performed according only to the technical idea of using both the wiring pattern 2a, which has a rectangular hole 12, and the wiring pattern 2b which has a square hole 12. That is, in a case where the bonding pad 10 differs in the area from the lead wire exposed portion 11 due to the difference in shape therebetween, the pad 10 differs from the exposed portion 11 in the area of the spread of molten solder on precoating with solder. This results in variation in the shape of the solder bumps 15 formed on the bonding pads 10. This variation causes variation in the connection strength when the semiconductor chip 5 is connected to the flip-chip mounting substrate 1.

However, in a case where both the wiring pattern 2a, which has a rectangular hole 12, and the wiring pattern 2b, which has a square hole 12, are provided, even when the wiring patterns 2a and 2b are formed so that the area of the bonding pad 10a is equal to that of the bonding pad 10b, the problem of the aforementioned adverse effects cannot be solved. This is because of the facts that the solder bumps 15 are formed by drawing solder provided on the lead wire exposed portion 11 extending continuously from the bonding pad 10 (incidentally, the solder film 16 remains on the lead wire exposed portion 11), and that thus the shape, more specifically, the total area of the lead wire exposed portion 11 affects the problem of the adverse effects (see FIGS. 4A to 4D).

That is, the problem of the adverse effects can be solved only by employing the configuration in which the bonding pads $10a$ and $10b$ are substantially equal in the area to each other and in which the total areas of the predetermined parts of the lead wires extending continuously from the bonding pads $10$, that is, the total areas of the lead wire exposed portions $11$ are substantially equal to each other. More particularly, the total amounts of solders drawn to the bonding pads $10$ can be equalized by employing the configuration in which the total areas of the lead wire exposed portions $11$ are substantially equal to each other. Additionally, the shapes of the solder bumps $15$ formed on the bonding pads can be made by employing the configuration, in which the areas of the bonding pads $10$ are substantially equalized to each other, to be the same. Consequently, an advantage in eliminating the variation in the shape of the solder bump $15$ can be obtained. Also, another advantage in stabilizing the connection strength can be obtained when the semiconductor chip $5$ and the flip-chip mounting substrate $1$ are connected to each other. Accordingly, an advantage in reducing a defective fraction of defective goods due to poor connection can be obtained.

Thus, according to the technical idea of the flip-chip mounting substrate $1$ of the invention, the aforementioned "range", in which the areas of the bonding pads (or the total areas of the exposed portions) are substantially equal to each other, are defined to be a range of the difference in the area between the bonding pads $10$ (or the difference in the total area between the lead wire exposed portions $11$), in which the solder bumps $15$ formed on the bonding pads $10$ at precoating of solder have substantially the same shape. The purport of the expression "the solder bumps $15$ have substantially the same shape" is that the "substantially the same shape" includes shapes of the solder bumps $15$ in a range in which the difference in the shape among the solder bumps $15$ does not affect the connection strength of the connection between the semiconductor chip $5$ and the flip-chip mounting substrate $1$.

Second Embodiment

Next, another embodiment of the wiring pattern $2$ is described below. FIG. $6$ illustrates the second embodiment of the wiring pattern $2$. This embodiment is obtained by changing the shape of the bonding pad $10b$ in the wiring pattern $2b$ of the first embodiment illustrated in FIG. $2$B to a square. That is, a wiring pattern $2c$ is obtained by changing the bonding pad $10b$ of the wiring pattern $2b$ to a square bonding pad $10c$. Incidentally, the area of the bonding pad $10b$ is substantially equal to that of the bonding pad $10c$.

Third Embodiment

FIGS. $7$A to $7$F illustrate a third embodiment of the wiring pattern $2$. The third embodiment generally changes the shape of the hole $12$ of the first embodiment of the wiring pattern $2$ illustrated in FIG. $2$B to a circle. Various types of the shape of the third embodiment are illustrated in FIGS. $7$A to $7$F. A wiring pattern $2d$ illustrated in FIG. $7$A has a circular bonding pad $10d$ and four lead wire exposed portions $11d_1$ to $11d_4$. A wiring pattern $2e$ illustrated in FIG. $7$B has a circular bonding pad $10e$ and three lead wire exposed portions $11e_1$ to $11e_3$. A wiring pattern $2f$ illustrated in FIG. $7$C has a circular bonding pad $10f$ and two lead wire exposed portions $11f_1$ and $11f_2$. A wiring pattern $2g$ illustrated in FIG. $7$D has a square bonding pad $10g$ and four lead wire exposed portions $11g_1$ to $11g_4$. A wiring pattern $2h$ illustrated in FIG. $7$E has a square bonding pad $10h$ and four lead wire exposed portions $11h_1$ to $11h_4$. A wiring pattern $2i$ illustrated in FIG. $2$F has a square bonding pad $10i$ and eight lead wire exposed portions $11i_1$ to $11i_8$. These areas are formed so that the areas of the bonding pads $10$ of these wiring patterns $2$ are substantially equal to one another, and that additionally, the total areas of the lead wire exposed portions $11$ are substantially equal to one another. More specifically, for example, the wiring pattern $2d$ illustrated in FIG. $7$A is compared with the wiring pattern $2i$ illustrated in FIG. $7$F. The wiring pattern $2d$ and the wiring pattern $2i$ are formed so that the area of the circular bonding pad $10d$ is substantially equal to that of the square bonding pad $10i$, and that the total area of the four lead wire exposed portions $11d_1$ to $11d_4$ is substantially equal to that of the eight lead wire exposed portions $11i_1$ to $11i_8$. FIGS. $7$A to $7$F illustrate only examples. The wiring patterns according to the invention are not limited to combinations of these examples.

Fourth Embodiment

FIG. $8$ illustrates a fourth embodiment of the wiring pattern $2$. The fourth embodiment is obtained by replacing the square hole $12b$ of the wiring pattern $2b$ illustrated in FIG. $2$B with a triangular hole $12j$. This wiring pattern $2j$ has a circular bonding pad $10j$ and three lead wires exposed portions $11j_1$ to $11j_3$. The wiring pattern $2j$ is formed so that the area of the bonding pad $10b$ is substantially equal to that of the bonding pad $10j$, and that additionally, the total area of the lead wire exposed portions $11b1$ to $11b4$ is substantially equal to that of the lead wire exposed portions $11j1$ to $11j3$.

Fifth Embodiment

FIG. $9$ illustrates a fifth embodiment of the wiring pattern $2$. The fifth embodiment is obtained by replacing the square hole $12b$ of the wiring pattern $2b$ illustrated in FIG. $2$B with a hexagonal hole $12k$. This wiring pattern $2k$ has a circular bonding pad $10k$ and three lead wire exposed portions $11k_1$ to $11k_3$. The wiring pattern $2k$ is formed so that the area of the bonding pad $10b$ is substantially equal to the area of the bonding pad $10k$, and that the total area of the lead wire exposed portions $11b_1$ to $11b_4$ is substantially equal to the total area of the lead wire exposed portions $11k_1$ to $11k_3$.

Sixth Embodiment

FIG. $10$ illustrates a sixth embodiment of the wiring pattern $2$. The sixth embodiment is obtained by replacing the square hole $12b$ of the wiring pattern $2b$ illustrated in FIG. $2$B with an octagonal hole $12l$. This wiring pattern $2l$ has a circular bonding pad $10l$ and four lead wire exposed portions $11l_1$ to $11l_4$. The wiring pattern $2l$ is formed so that the area of the bonding pad $10b$ is substantially equal to the area of the bonding pad $10l$, and that the total area of the lead wire exposed portions $11b_1$ to $11b_4$ is substantially equal to the total area of the lead wire exposed portions $11l_1$ to $11l_4$.

As described above, FIGS. $6$ to $10$ illustrate a part of embodiments of the wiring pattern. In the wiring pattern $2$, the shapes of the hole $12$ are changed to a square, a circle, or the like. Thus, the density of the wiring patterns $2$ arranged in the substrate inner portion $21$ in an area array arrangement can be increased. Each of such wiring patterns $2$ is formed so that the areas of the bonding pad $10$ are substantially equal to one another, and that the total areas of the lead wire exposed portions $11$ are substantially equal to one another. Thus, the total amounts of solder drawn to the bonding pads $10$ can be substantially equalized. Also, the solder bumps $15$ formed on the bonding pads can be made to have substantially the same shape. Consequently, the variation in the shape of the solder bump $15$ is eliminated. Additionally, the effects of stabilizing the connection strength of the connection between the semiconductor chip 5 and the flip-chip mounting substrate 1 are obtained. As long as advantages according to the invention can be obtained, the shape of the solder bump is not limited to those illustrated in the drawings.

Seventh Embodiment

Figure 11A:
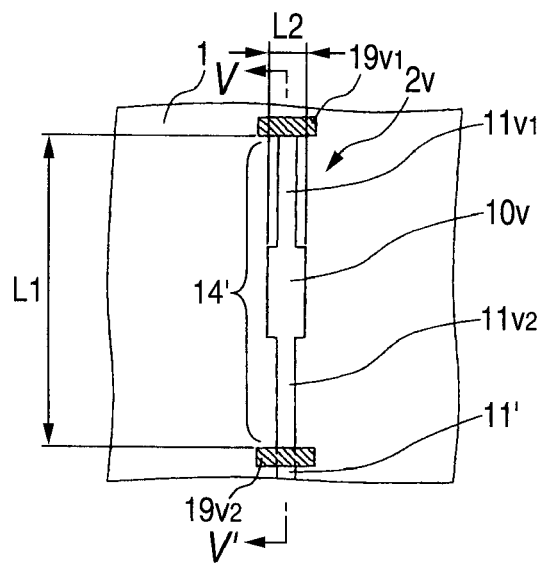
FIGS. 11A to 11D are schematic views illustrating wiring patterns formed on a flip-chip mounting substrate according to a seventh embodiment.
Figure 11B:
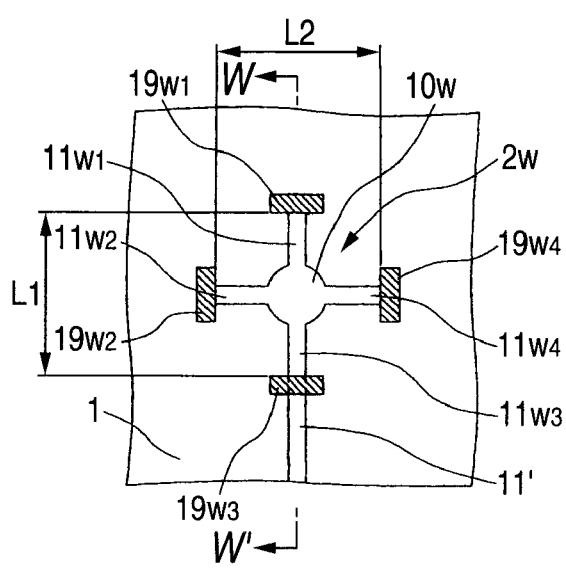

Next, an embodiment having a configuration, in which the wiring pattern 2 provided on an insulating layer of the flip-chip mounting substrate 1 is partitioned by dam-like solder resists (hereunder referred to as "solder resist dam 19") instead of the aforementioned solder resist 18 and the aforementioned hole 12, is described below. FIGS. 11A and 11B illustrate a seventh embodiment of the wiring pattern 2. The seventh embodiment is such that a bonding pad 10 and the lead wire 11' continuously extending from the bonding pad 10 are formed on a mounting surface of the flip-chip mounting substrate 1 in general, and that the lead wire exposed portion 11 is constructed by partitioning the lead wire 11' with the solder resist dams 19.

Figure 11C:
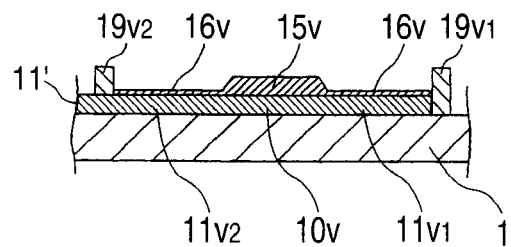

More specifically, a wiring pattern $2v$ illustrated in FIG. 11A is provided with solder resist dams $19v_1$ and $19v_2$ instead of the solder resist 18 and the hole $12a$ of the wiring pattern $2a$ illustrated in FIG. 2A. This wiring pattern $2v$ has a rectangular bonding pad $10v$ and two lead wire exposed portions $11v_1$ and $11v_2$. The wiring pattern $2v$ is formed so that the area of the bonding pad $10a$ is substantially equal to the area of the bonding pad $10v$, and that the total area of the lead wire exposed portions $11a_1$ and $11a_2$ is substantially equal to the total area of the lead wire exposed portions $11v_1$ and $11v_2$. FIG. 11C is a cross-sectional view of the wiring pattern $2v$.

Figure 11D:
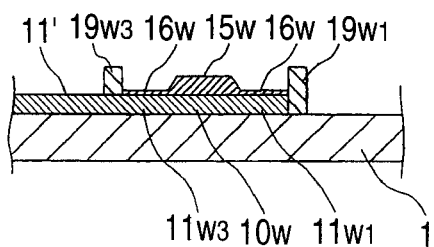

A wiring pattern $2w$ illustrated in FIG. 11B is provided with solder resist dams $19w_1$ to $19w_4$ instead of the solder resist 18 and the hole $12b$ in the wiring pattern $2b$ illustrated in FIG. 2B. The wiring pattern $2w$ is formed so that the area of the bonding pad $10b$ is substantially equal to the area of the bonding pad $10w$, and that the total area of the lead wire exposed portions $11b_1$ to $11b_4$ is substantially equal to the total area of the lead wire exposed portions $11w_1$ to $11w_4$. FIG. 11D is a cross-sectional view of the wiring pattern $2w$.

As described above, FIGS. 11A and 11B illustrates an embodiment having the solder resist dams 19. The wiring pattern $2v$ has advantages similar to those of the aforementioned wiring pattern $2a$. Also, the wiring pattern $2w$ has advantages similar to those of the aforementioned wiring pattern $2b$. Incidentally, in the case of the seventh embodiment, various modifications can be considered in view of the shapes of bonding pad 10 and the lead wire exposed portion 11, similarly to the above case. For example, the wiring patterns illustrated in FIGS. 6 to 10 can be applied to the seventh embodiment.

Eighth Embodiment

Next, an embodiment obtained by changing the wiring pattern 2 having the aforementioned hole 12, which is formed on the insulating of the flip-chip mounting substrate 1, so as to have no hole 12 is described below. FIGS. 12A to 12D illustrate an eighth embodiment of the wiring pattern 2. The eighth embodiment is configured so that the bonding pad 10 and the lead wire exposed portion 11 are exposed to the solder resist 18 of the most front surface of the flip-chip mounting substrate 1. An electrically insulating layer can be used instead of the solder resist 18 in such a manner as to constitute the flip-chip mounting substrate 1.

Figure 12A:
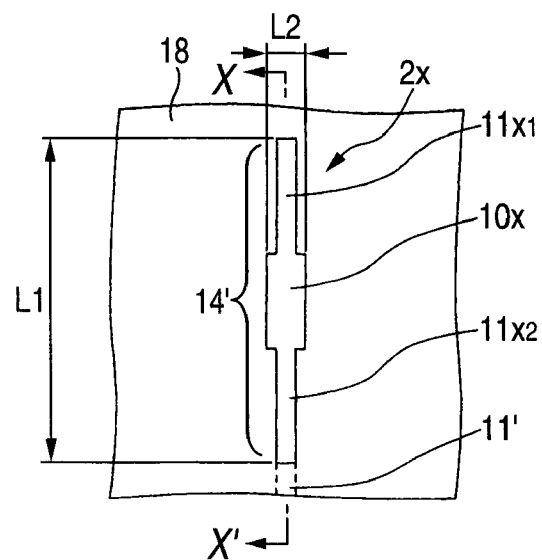
FIGS. 12A to 12D are schematic views illustrating wiring patterns formed on a flip-chip mounting substrate according to an eighth embodiment.

More specifically, a wiring pattern $2x$ illustrated in FIG. 12A is obtained by changing the wiring pattern $2a$ having the hole $12a$, as illustrated in FIG. 2A, in such a manner as not to have the hole. FIG. 12C is a cross-sectional view of the wiring pattern $2x$. The wiring pattern $2x$ has a rectangular bonding pad $10x$ and two lead wire exposed portions $11x_1$ and $11x_2$. The wiring pattern $2x$ is formed so that the area of the bonding pad $10a$ is substantially equal to the area of the bonding pad $10x$, and that the total area of the lead wire exposed portions $11a_1$ and $11a_2$ is substantially equal to the total area of the lead wire exposed portions $11x_1$ and $11x_2$.

Figure 12B:
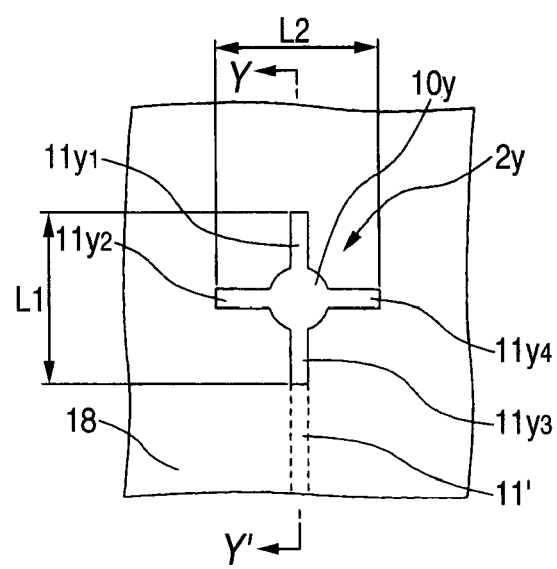
Figure 12C:
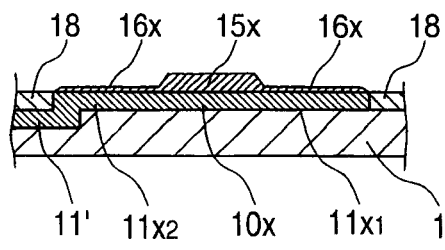
Figure 12D:
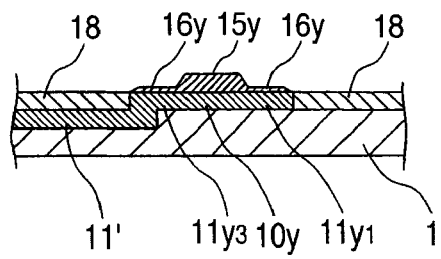

Additionally, a wiring pattern $2y$ illustrated in FIG. 12B is obtained by changing the wiring pattern $2b$ having the hole $12b$, as illustrated in FIG. 2B, in such a manner as not to have the hole. FIG. 12D is a cross-sectional view of the wiring pattern $2y$. The wiring pattern $2y$ has a circular bonding pad $10y$ and four lead wire exposed portions $11y_1$ to $11y_4$. The wiring pattern $2y$ is formed so that the area of the bonding pad $10b$ is substantially equal to the area of the bonding pad $10y$, and that the total area of the lead wire exposed portions $11b_1$ to $11b_4$ is substantially equal to the total area of the lead wire exposed portions $11y_1$ to $11y_4$.

As described above, FIGS. 12A to 12D illustrate the eighth embodiment configured by exposing the surfaces of the bonding pad and the lead wire exposed portion 11 to the solder resist 18, without being provided with the hole 12. The wiring pattern $2x$ has advantages similar to those of the wiring pattern $2a$. The wiring pattern $2y$ has advantages similar to those of the wiring pattern $2b$. Incidentally, in the case of the eighth embodiment, various modifications can be considered in view of the shapes of bonding pad 10 and the lead wire exposed portion 11, similarly to the above case. For example, the wiring patterns illustrated in FIGS. 6 to 10 can be applied to the eighth embodiment.

As described above, in accordance with the flip-chip mounting substrate according to the invention of the present application, in a case where the semiconductor chip having bumps provided in an area array arrangement is flip-chip-mounted thereon, the density of the bonding pads, to which the bumps are connected, can be increased. Consequently, what is called a narrow pitch connection can be implemented in the substrate. Also, the functionality of a semiconductor device can be enhanced. Additionally, the problem of the variation in the shape of the solder bumps formed at precoating with solder, which may be caused in increasing the density of the bonding pads that are arranged in an area array arrangement and are used in flip-chip-mounting, can be solved. Consequently, an advantage in stabilizing the connection strength of the connection between the semiconductor chip and the flip-chip mounting substrate can be obtained. Accordingly, a defective fraction of defective goods due to poor connection can be reduced.

Incidentally, the invention is not limited to the case of flip-chip mounting a semiconductor device on amounting substrate. Apparently, the invention can be applied to the case of flip-chip mounting a package.

What is claimed is:
1. A flip-chip mounting substrate comprising:
an insulating layer or a solder resist;
a plurality of first wiring patterns each including:
  a first bonding pad exposed from the insulating layer or the solder resist; and
  a first lead wire continuously extending from the first bonding pad, the first lead wire having first predetermined parts exposed from the insulating layer or the solder resist; and
a plurality of second wiring patterns each including:
  a second boding pad exposed from the insulating layer or the solder resist; and a second lead wire continuously extending from the second bonding pad, the second lead wire having second predetermined parts exposed from the insulating layer or the solder resist, wherein a geometric shape of each of the first bonding pads is different from that of each of the second bonding pads, while a planar area of each of the first bonding pads is equal to that of each of the second bonding pads, and wherein a geometric shape of each of the first predetermined parts in a plan view is different from that of each of the second predetermined parts, while a planar area of each of the first predetermined parts is equal to that of each of the second predetermined parts.

2. The substrate of claim 1, wherein each of the first bonding pads is formed such that a length dimension thereof is different from a width dimension thereof, and wherein each of the second bonding pads is formed such that a length dimension thereof is equal to a width dimension thereof.

3. The substrate of claim 2, wherein the plurality of first wiring patterns are arranged at a substrate outer side, and the plurality of second wiring patterns are arranged at a substrate inner side.

* * * * *